United States Patent [19]
Endoh

[11] Patent Number: 6,007,729
[45] Date of Patent: Dec. 28, 1999

[54] CARRIER TAPE AND MANUFACTURING METHOD OF SAID CARRIER TAPE

[75] Inventor: Kiyohito Endoh, Urawa, Japan

[73] Assignee: Texas Instruments Incorporated, Dallas, Tex.

[21] Appl. No.: 08/947,007

[22] Filed: Oct. 8, 1997

[30] Foreign Application Priority Data

Oct. 9, 1996 [JP] Japan ..................................... 8-287656

[51] Int. Cl.⁶ .............................. H01L 21/00; B44C 1/22
[52] U.S. Cl. ................................. 216/14; 216/39; 216/47; 216/31; 257/666; 29/827; 438/754; 361/813
[58] Field of Search .................................. 216/14, 18, 31, 216/39, 41, 47, 56; 257/666, 668, 670, 672; 29/827; 438/111, 461, 720, 742, 754; 361/813

[56] References Cited

U.S. PATENT DOCUMENTS

| | | | |
|---|---|---|---|
| 3,795,044 | 3/1974 | Peltz | 216/14 X |
| 4,711,700 | 12/1987 | Cusack | 216/14 |
| 4,733,292 | 3/1988 | Jarvis | 216/14 X |
| 4,786,545 | 11/1988 | Sakuma et al. | 216/14 X |

*Primary Examiner*—William Powell
*Attorney, Agent, or Firm*—William B. Kempler; Richard L. Donaldson

[57] ABSTRACT

The purpose of this invention is to provide a type of carrier tape with inner leads arranged at small pitches.

When first wirings 11, second wirings 12, and pitch-converting wirings 14 are formed by etching resin film 8, second wirings 12 and pitch-converting wirings 14 become thinner than first wirings 11. First wirings 11 are formed on film tape 3, and second wirings 12 are formed in hole 15 formed on the aforementioned film tape. Also, pitch-converting wirings 14 are formed on resin film 9 formed in said hole 15. In this way, second wirings 12 arranged at small pitches and first wirings 11 arranged at large pitches can be connected to each other by pitch-converting wirings 14 without creating any short circuit. First wirings 11 can be used for connection to a liquid crystal panel, and second wirings 12 can be used for connection to semiconductor elements.

14 Claims, 12 Drawing Sheets

CARRIER TAPE AND MANUFACTURING METHOD OF SAID CARRIER TAPE

FIELD OF THE INVENTION

This invention pertains to a type of carrier tape. In particular, this invention pertains to a type of carrier tape that can be used to carry semiconductor elements with small inter electrode gaps.

BACKGROUND OF THE INVENTION

In recent years, to meet the demand on realizing a high density for electronic devices, a carrier tape, which can accommodate semiconductor elements in a film tape and can be assembled on a liquid crystal panel or a printed circuit board, has been widely used.

A conventional technique of such a carrier tape will be explained in the following.

Figure 11A:
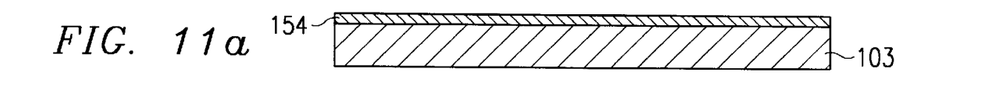
FIGS. 11(a)–(g) are the manufacturing process diagrams of a conventional carrier tape.

Symbol 103 in FIG. 11(a) represents a film tape. An adhesive is coated on the surface of the film tape in advance to form adhesive layer 154.

Figure 11B:
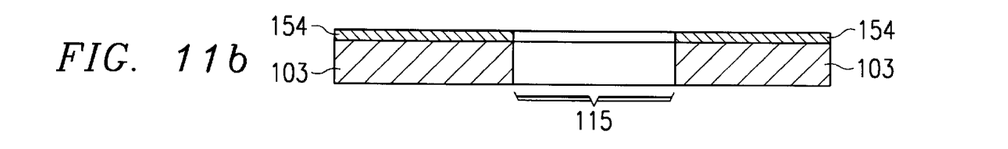
Figure 11C:
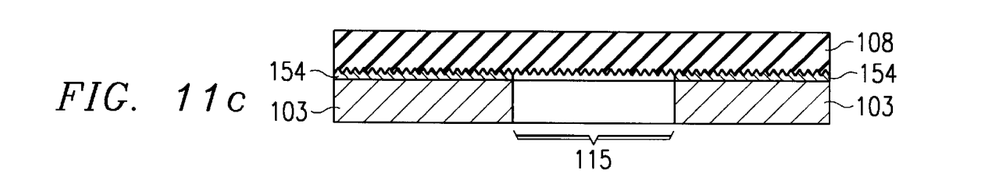

Said film tape 103 is punched to form hole 115 (FIG. 11(b)). Metal foil (metal film) 108 is then laminated on adhesive layer 154 (FIG. 11(c)). In the aforementioned hole, there are other holes not shown in the figure and used when film tape 103 is cut or used for positioning. However, hole 115 shown in FIG. 11 is called a device hole for accommodating semiconductor elements. The inner surface of metal foil 108 is subjected to a roughening treatment to improve the adhesion to film tape 103. Therefore, the bumps and dips on the inner surface of the metal film are exposed in the device hole.

When the tape is dipped in an etching solution for a chemical polishing treatment to degrease and smoothen the surface after metal foil 108 is laminated, the exposed portion of metal foil 108 is etched. In this case, not only the surface of metal foil 108, but also the inner surface of metal foil 108 exposed from hole 115, are etched and become smooth.

Figure 11D:
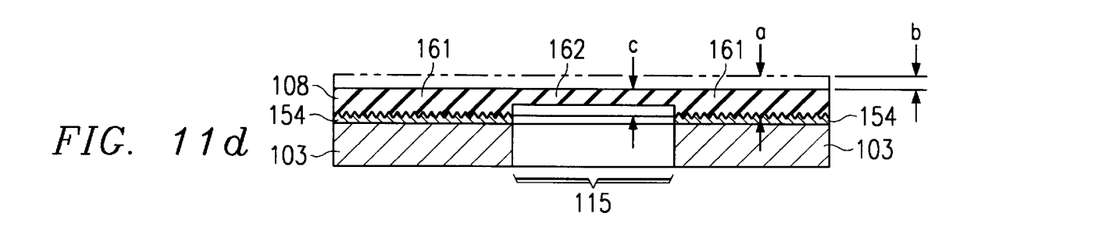

When the original thickness of metal foil 108 and the etching quantities on the surface and the inner surface are taken as a, b, and c, respectively, the thickness of portion 161 of metal foil 108 positioned on film tape 103 becomes a–b, while the thickness of portion 162 positioned on device hole 115 becomes even smaller, that is, a–(b+c) (FIG. 11(d)).

Figure 11E:
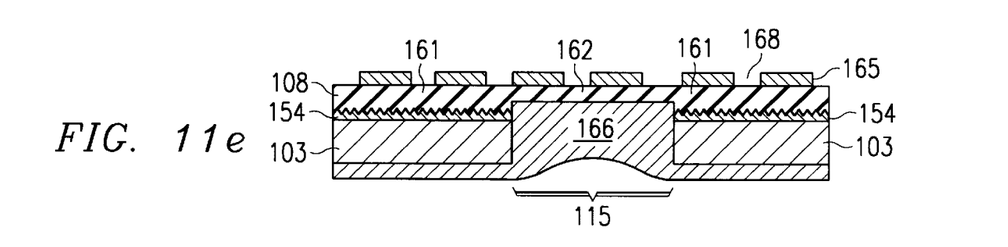
Figure 11F:
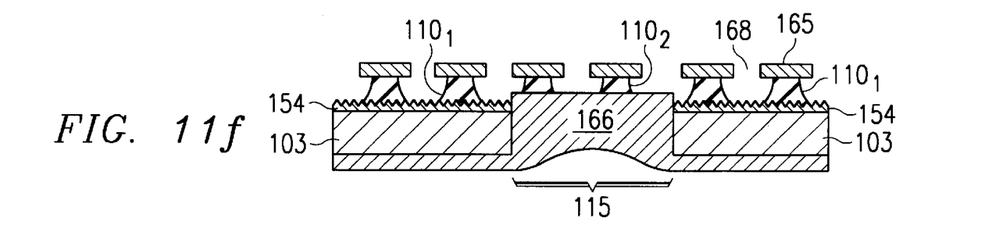
Figure 11G:
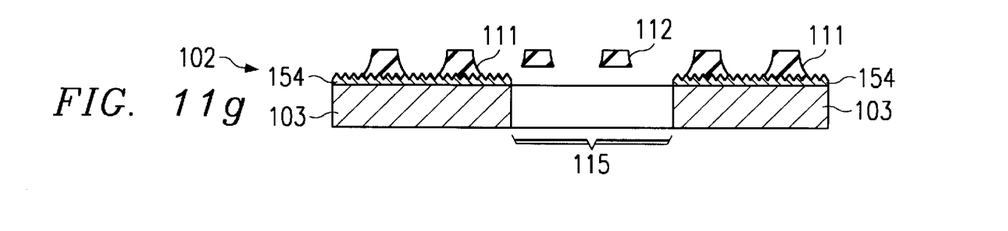

Subsequently, resist film 166 is formed on the whole inner surface of film tape 103, with resist film 165 being formed on the surface of etched metal foil 108. Resist film 165 is patterned as shown in FIG. 11(e). When the tape is dipped in an etching solution at this time, metal foil 108 is etched from opening portions 168 of resist film 165. In this way, patterned metal film wirings $110_1$ and $110_2$ are formed on film tape 103 and resist film 166 on the inner surface, respectively (FIG. 11(f)).

Subsequently, when a peeling treatment is performed to remove patterned resist film 165, first wirings 111 are formed from metal film wirings $110_1$ on film tape 103. When resist film 166 on the inner surface is removed at the same time to expose device hole 115, one end of each metal film wiring ($110_2$) on resist 166 on the inner surface is fixed on film tape 103, while the other end is suspended over device hole 115 to form second wiring 112 called an inner lead (FIG. 11(g)).

After a protective film is formed on a portion of each first wiring 111 of said carrier tape 102, semiconductor elements are accommodated in the device hole, and the electrodes on the semiconductor elements are electrically connected to second wirings 112. Subsequently, the semiconductor elements are potted and covered by resin, followed by performing electrical experiments. When the carrier tape is assembled on a liquid crystal panel, the electrode on the liquid crystal panel is connected to a portion of the first wiring after film tape 103 is cut for each semiconductor element.

Because carrier tape 102 in the conventional technique is formed by the aforementioned manufacturing operation, first wiring 111 is different from second wiring 112 in thickness. Because metal foil 108 is generally etched by means of wet etching, the etching reaction is carried out from opening portions 168 in a direction parallel to the surface of the carrier tape, resulting in a large side etching quantity. Consequently, it is difficult to realize fine patterning in the thick portions of metal foil 108.

Figure 12:
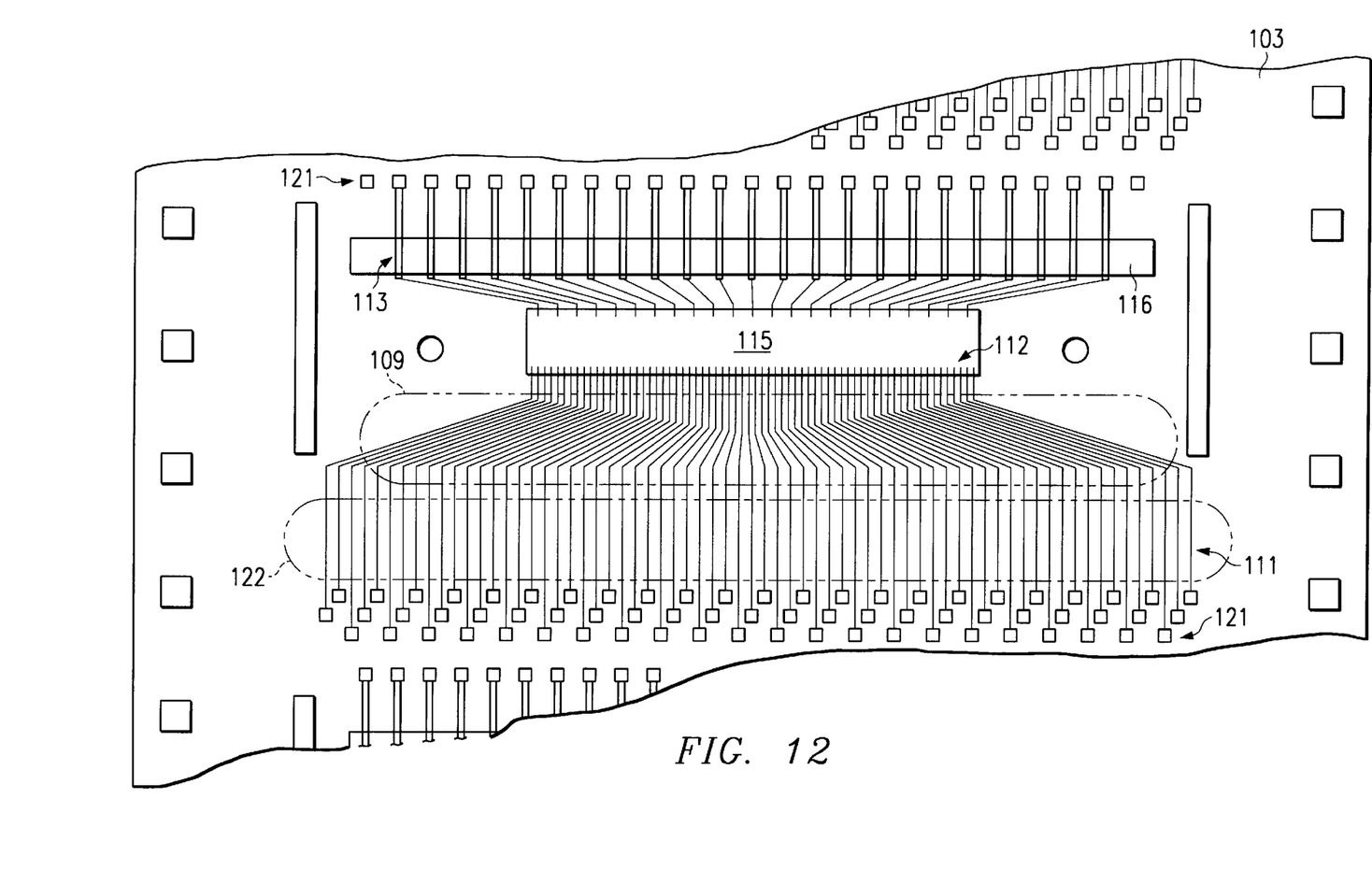
FIG. 12 is a plan view illustrating the conventional carrier tape.

FIG. 12 is the plane view of said carrier tape 102. Second wirings 112 used for connection to the electrodes on the semiconductor elements are arranged at small pitches on the periphery of device hole 115.

Symbol 116 in FIG. 12 represents a lead hole. It is formed at the same time that film tape 3 is punched to form device hole 115. Wirings 113 are formed at large pitches on said lead hole. When the wirings are connected to the electrodes on a printed circuit board, a heating jig is applied from the outer surface or the inner surface to perform a soldering connection.

Symbols 121 represent pads for a test performed on film tape 103 at the same time that first wirings 111 are formed. These pads are used for the electrical testing of the semiconductor elements. Symbol 122 represents an electrode portion of each first wiring 111 connected by an electroconductive resin to the electrodes formed on a liquid crystal panel.

Because the electrodes on the semiconductor elements accommodated in device hole 115 are formed at small intervals, it is necessary to use second wirings 112 at small pitches. On the other hand, because the electrodes are arranged at relatively large intervals on the liquid crystal panel, portions 122 of first wirings 111 connected to the panel are formed at large pitches.

Because the wiring pitch requested by first wirings 111 is different from that requested by second wirings 112, a pitch-converting portion 109 is formed by first wirings 111. When portions 122 of first wirings 111 connected to the liquid crystal panel are connected to the portions of second wirings 112 connected to the semiconductor elements, respectively, first wirings 111 in pitch-converting portion 109 on the side of portions 122 connected to the liquid crystal panel have to be formed at the pitches as large as those among portions 122. On the other hand, first wirings 111 in pitch-converting portion 109 on the side of second wirings 112 have to be formed at pitches that are as small as those among the second wirings.

However, as the number of pins of the semiconductor elements is increased, the pitches among second wirings 112 used for element connection become even narrower. On the other hand, because the bottom surface of first wirings 111 is subjected to a roughening treatment to improve the adhesion to film tape 103, the etching time for performing fine patterning in pitch-converting portion 109 becomes short when pitch-converting portion 109 is formed from first wirings 111 using the conventional technique. When this takes place, the metal film of first wirings 111 cannot be completely etched, and the remaining metal film is left over on adhesive layer 154. Consequently, the portions connected to second wirings 112 are shorted and defective products are manufactured, which is a problem.

The purpose of this invention is to solve the aforementioned problem of the conventional technique by providing a type of carrier tape that can be used for semiconductor elements with many pins.

SUMMARY OF THE INVENTION

In order to solve the aforementioned problem, one aspect of this invention discloses a type of carrier tape characterized by the following facts: after a hole is formed on a film tape, a metal film is laminated on the aforementioned film tape the portion of the metal film exposed from the aforementioned hole is thinned by means of etching, and a resin film is formed at a prescribed position on the aforementioned film tape and on the inner surface of the aforementioned metal film.

The carrier tape disclosed in another aspect of this invention is derived from the carrier tape in which after the aforementioned resin film is formed, the inner surface of the metal film is protected by a resist film, and a patterned resist film is formed on the outer surface of the metal film; the aforementioned metal film is then etched. Afterwards, the resist film on the aforementioned inner surface and the aforementioned patterned resist film is removed, multiple first wirings are formed on the aforementioned film tape, multiple second wirings arranged at a smaller pitch than that of the aforementioned first wirings are formed on the aforementioned hole, and pitch-converting wirings, which connect the aforementioned various first wirings to the aforementioned various second wirings, respectively, are formed on the aforementioned resin film.

A third aspect of this invention discloses a type of carrier tape having it a film tape and a hole formed on this film tape; by etching the aforementioned film tape and a metal film formed on the aforementioned hole, first wirings and second wirings, which are thinner than the aforementioned first wirings, are formed on the aforementioned film tape and the aforementioned hole, respectively; the aforementioned first and second wirings are connected to each other by pitch-converting wirings that are thinner than the aforementioned first wirings.

The carrier tape disclosed in a fourth aspect of this invention is derived from the carrier tape having the fact that the aforementioned pitch-converting wirings are formed on a resin film.

The carrier tape disclosed in a fifth aspect of this invention has a protective film is formed on the aforementioned pitch-converting wirings.

The carrier tape disclosed in a sixth aspect of this invention in which the second wiring is used for connection to a semiconductor element, with a portion of the aforementioned first wiring being used for connection to a liquid crystal panel.

This invention discloses a manufacturing method of a carrier tape characterized by the following facts: a hole is opened on a film tape; a metal film is then laminated on the aforementioned film tape; after the exposed portion of the aforementioned metal film is thinned by means of etching, the inner surface of the aforementioned metal film is protected by a resist film, and a patterned resist film is formed on the outer surface of the metal film. The aforementioned metal film is etched; afterwards, the aforementioned patterned resist film and the resist film on the aforementioned inner surface are removed; in this way, first wirings are formed on the aforementioned film tape, and second wirings are formed on the aforementioned hole. In this manufacturing method, the aforementioned resist film for protecting the inner surface of the resist film is formed after a resin film is formed at a prescribed position on the inner surface of the resist film exposed from the aforementioned hole; the aforementioned resin film remains when the aforementioned patterned resist film and the aforementioned resist film on the inner surface of the metal film are removed.

The manufacturing method of a carrier tape disclosed in another aspect of this invention in which, after the aforementioned resin film is formed, the aforementioned metal film is etched; after the operation for forming the next resin film at a prescribed position on the inner surface of the metal film exposed from the aforementioned metal film is performed for a prescribed number of rounds, the resist film is formed on the aforementioned inner surface.

The manufacturing method of carrier tape disclosed in a ninth aspect of the invention in which, when the aforementioned first and second wirings are formed, multiple pitch-converting wirings are formed on the aforementioned resin film, depending on the aforementioned patterned resist film; the aforementioned first wirings and second wirings are connected to each other by the aforementioned pitch-converting wirings formed on the aforementioned resin film, respectively.

According to this invention, an adhesive layer is formed on a film tape in advance, and a hole is formed on the film tape using a die. Subsequently, a metal film, such as a metal foil, is adhered to the adhesive layer. Because the inner surface of the metal film is exposed from the hole when the metal film is laminated, the exposed portion of the metal film is etched to degrease and smoothen the inner surface.

After the metal film is processed as described above, a resist film is formed on the whole inner surface of the film tape, with a patterned resist film being formed on the surface of the metal film. Subsequently, when the metal film is etched, the pattern of the resist film is transferred onto the metal film. When the resist film is peeled off, the first and second wirings can be formed on the film tape and on the hole, respectively, in the portions where the metal film remains.

In the case, the resist film on the inner surface is formed after a resin film is formed at the prescribed positions on the inner surface of the metal film exploded via the hole. When the first and second wirings are formed by means of etching, multiple pitch-converting wirings are formed on the resin film with the aid of the patterned resist film. The resin film remains when the patterned resist film and the resist film on the inner surface are removed. In this way, the pitch-converting wirings can be formed on the resin film at the same time that the first and second wirings formed.

When etching is performed for degreasing, the portions positioned on the hole of the metal film become thinner than the portions positioned on the film by as much as the etching quantity of the inner surface. Consequently, the pitch-converting wirings and the second wirings can be patterned to a finer extent than the first wirings. As a result, when the first wirings are connected to the second wirings by the pitch-converting wirings, it is possible to obtain a carrier tape with the second wirings formed at small pitches corresponding to the semiconductor elements with narrow gaps among the electrodes.

It is good to form a protective film on the aforementioned pitch-converting wirings because this protective film can prevent damage during transport and processing.

In the aforementioned carrier tape, because the second wirings can be formed at small pitches, portions of the first wirings can be formed at large pitches over a wide range. Also, the second wirings can be used for connection with the semiconductor elements, and the first wirings can be used for connection with the liquid crystal panel.

For the resin film formed on the inner surface of the metal film, after the first layer of resin film is formed, the metal film is etched again. Subsequently, after the second layer of resin film is formed, the resist film is formed on the inner surface. Consequently, there are three types of thicknesses for the metal film. This facilitates the pattern design. When etching of the metal film and formation of the resin film are performed for a prescribed number of rounds, it is possible to get the essential type of thickness for the metal film.

BRIEF DESCRIPTION OF THE DRAWINGS

FIG. 1

FIG. 2

FIG. 3

FIG. 4

FIG. 5

FIG. 6

FIG. 7

FIG. 8

FIG. 9

FIG. 10

FIG. 10 illustrates another example of the carrier tape of this invention.

FIG. 11

FIG. 12

REFERENCE NUMERALS AND SYMBOLS AS SHOWN IN THE DRAWINGS

In the FIGS., 2, 2', and 2" represent carrier tapes; 3 represents a film tape; 5 represents a patterned resist film; 6, 7, 15, 16, 17, $25_1$, and $25_2$ represent holes; 8 represents a metal foil (metal film); 9 represents a resin film; 11 represents first wiring; 12 represents second wiring; 14 represents a pitch-converting wiring; and 17 represents a resist film on inner surface.

Description of the Embodiments

Embodiments of this invention will be explained in the following. These embodiments disclose a type of carrier tape, which is used to carry the semiconductor elements of a circuit for driving a liquid crystal panel, as well as its manufacturing method.

Figure 1A:
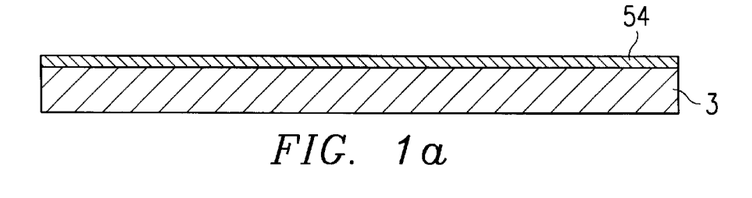
FIGS. 1(a)–(e) are the first half of the process diagrams illustrating an example of the manufacturing method of a carrier tape disclosed in this invention.
Figure 6A:
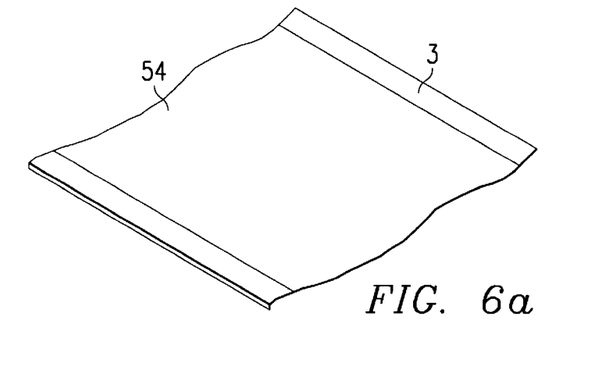
FIGS. 6(a)–(d) are diagrams for explaining the process of the manufacturing method of a carrier tape disclosed in this invention.

Symbol 3 in FIG. 1(a) (a cross-sectional view) and FIG. 6(a) (an oblique view) represents a film tape (width: 35–70 mm). An adhesive is coated on the surface of the film tape in advance to form adhesive layer 54.

Figure 1B:
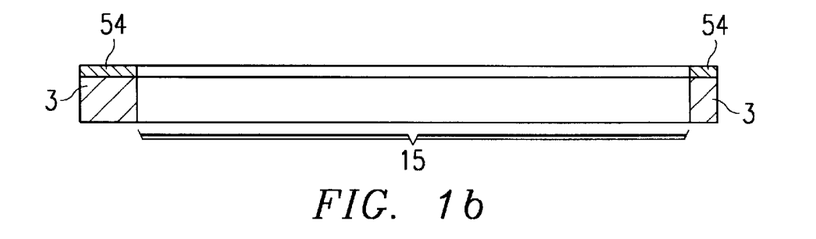
Figure 1C:
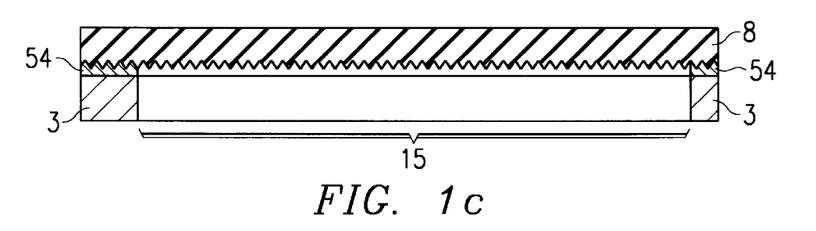
Figure 1D:
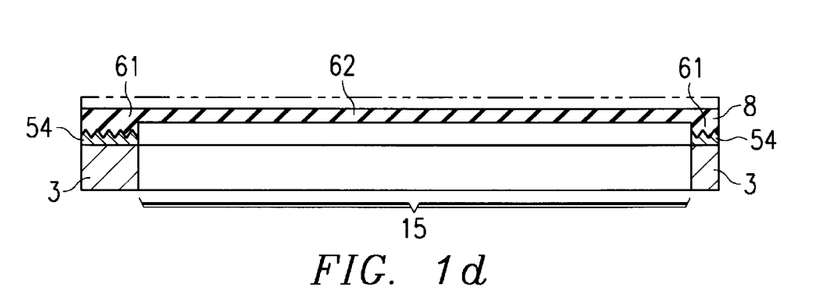
Figure 6B:
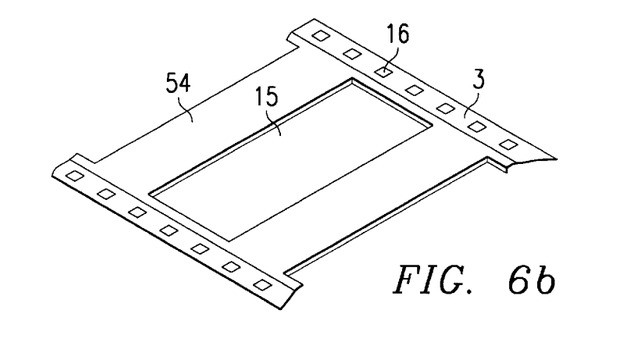
Figure 6C:
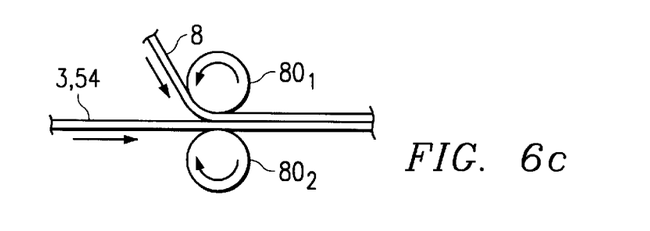
Figure 6D:
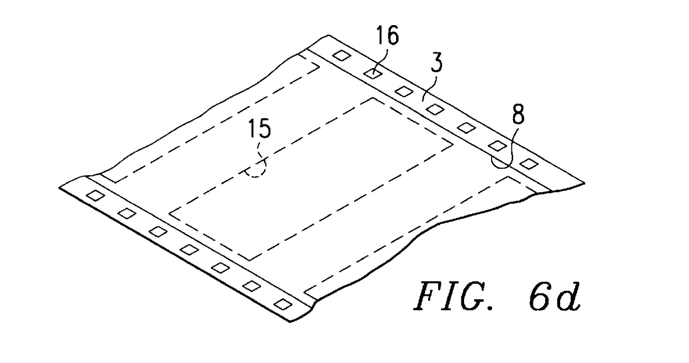

Said film tape 3 is punched using dies to form holes 15 and 16 (FIGS. 1(b) and 6(b)). Subsequently, as shown in FIG. 6(c), metal foil (metal film) 8 (film thickness: 35–100 μm) made of a conductor is pressed on adhesive layer 54 by rollers $80_1$ and $80_2$. In this way, metal foil 8 is laminated on film tape 3. At this time, hole 15 in the range of adhesive layer 54 is covered by metal foil 8 (FIGS. 1(c) and 6(d)).

Figure 7A:
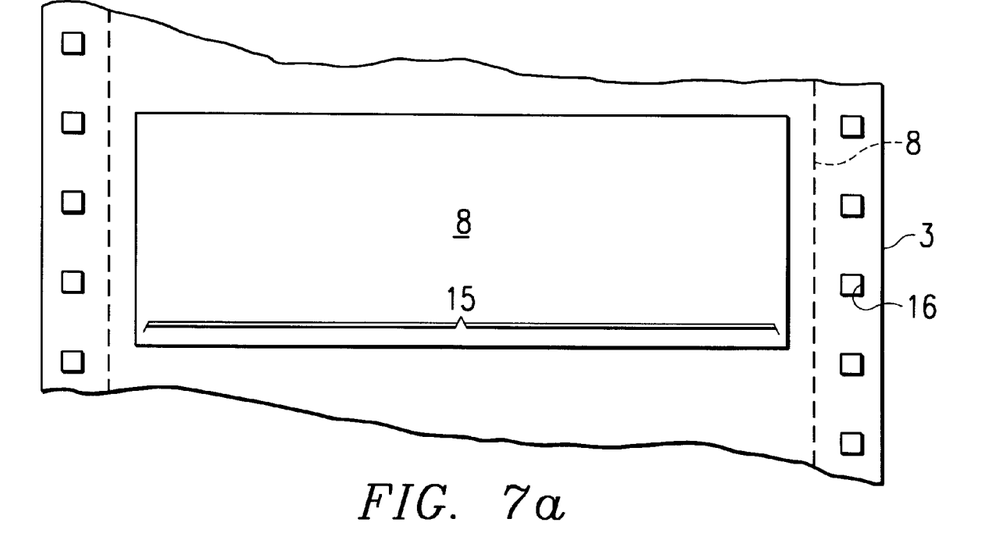
FIGS. 7(a) and 7(d) are plan views illustrating the state of the inner surface during the process for manufacturing the carrier tape of this invention.

The inner surface in this state is shown in FIG. 7(a). The inner surface of metal foil 8 is subjected to a roughening treatment to increase the adhesive strength. The bumps and dips on the rough surface are exposed in hole 15. Hole 16 is used for transport. Metal foil 8 is appropriately laminated so that it does not cover hole 16.

When the tape is dipped in an etching solution for a chemical polishing treatment to degrease and smoothen the surface after metal foil 8 is laminated, the surface of the exposed portion of metal foil 108 is etched. The inner surface (rough surface) of metal foil 8 exposed in hole 15 becomes smooth. However, portion 62 positioned on hole 15 is thinner than portion 61 positioned on film tape 3 by as much as the polishing quantity of the inner surface.

Figure 1E:
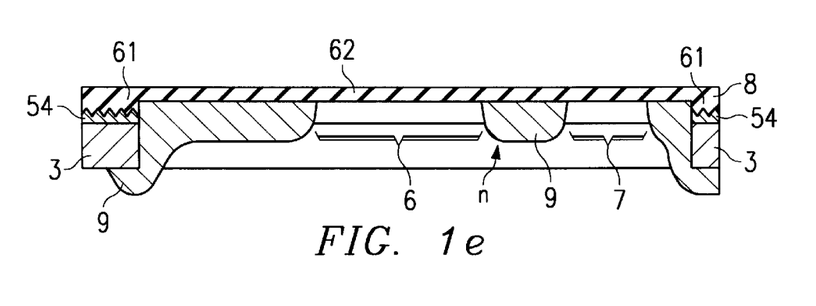
Figure 7B:
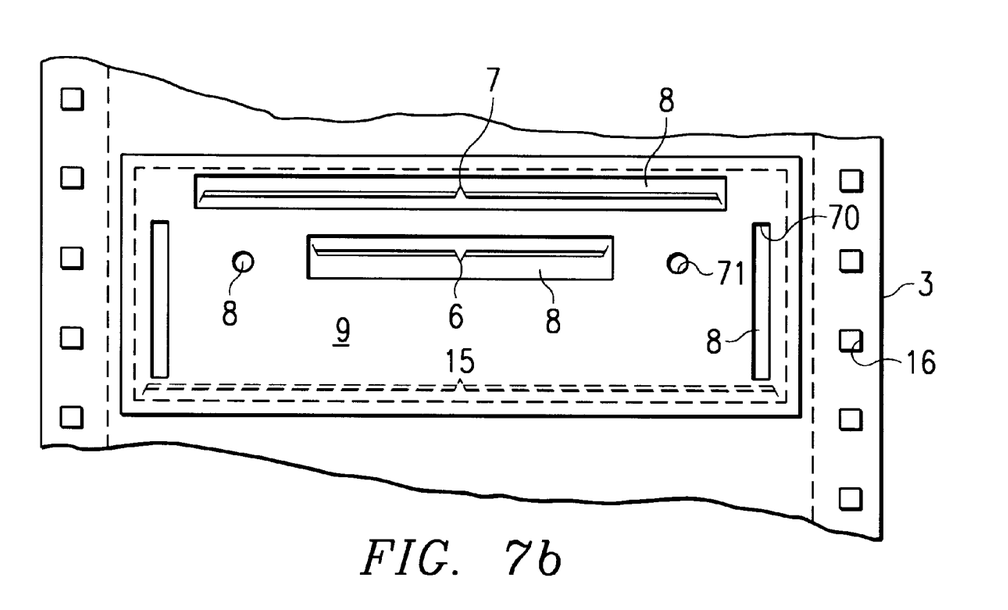

Subsequently, resin film 9 (a polymide film with a thickness of 30 μm) is formed at a prescribed position on the inner surface of metal foil 8 exposed from hole 15. The resin film is etched to a prescribed pattern using a resist film not shown in the figure (FIG. 1(e)). FIG. 7(b) is a plane view illustrating the inner surface in this state. Resin film 9 is adhered and fixed to film tape 3 and metal foil 8. Device hole 6 and lead hole 7, as well as narrow groove 70 for cutting and fixture hole 71 for positioning, are formed in the portions where said resin film 9 is not formed. The inner surface of metal foil 8 is exposed in said device hole 6, lead hole 7, narrow groove 70 for cutting, and fixture hole 71 for positioning.

Figure 2F:
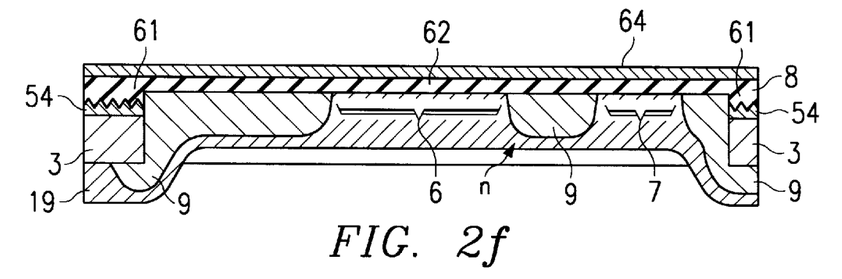
FIGS. 2(f)–(i) are the second half of the aforementioned process diagrams.
Figure 2G:
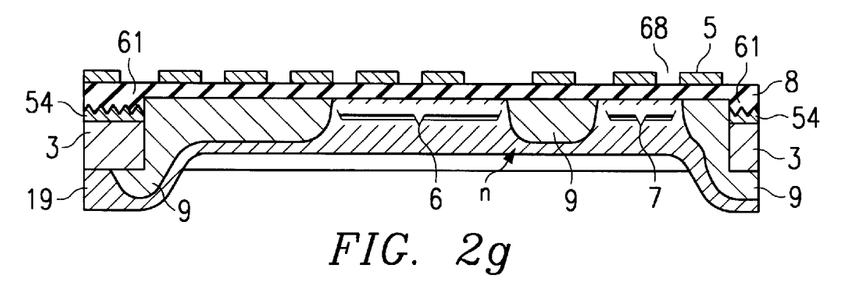
Figure 8A:
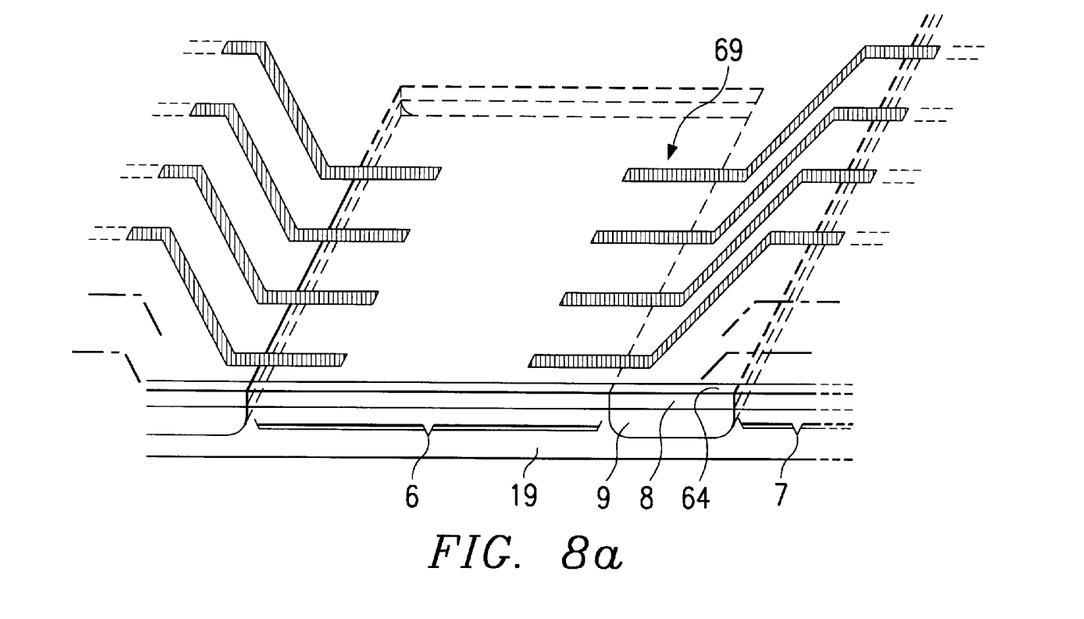
FIGS. 8(a) and 8(b) are oblique views illustrating the state during the manufacturing process of the carrier tape of this invention.
Figure 8B:
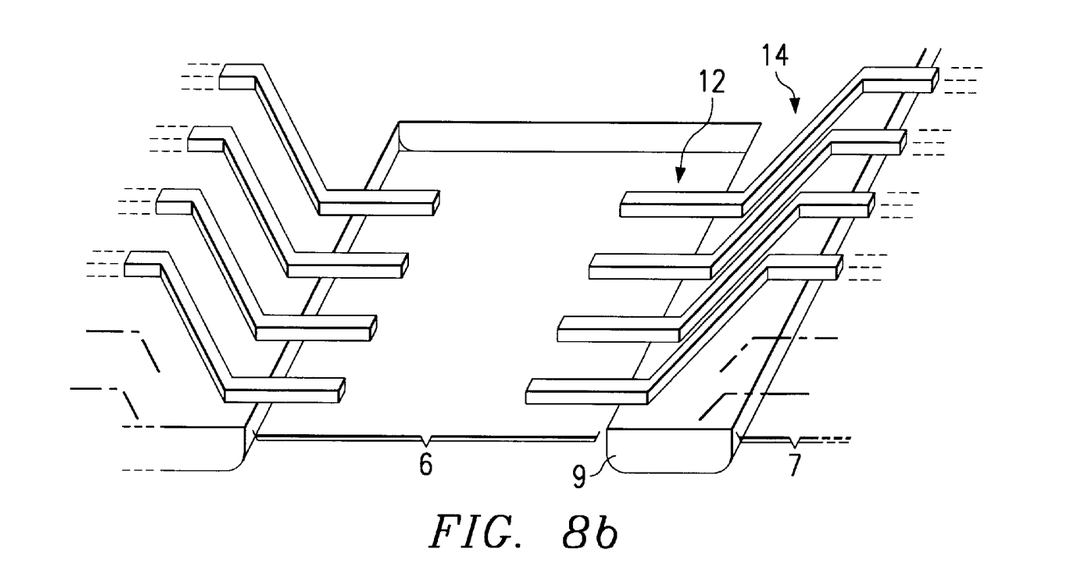

Inner surface resist film 19 is formed on resin film 9 and metal foil 8 exposed from the aforementioned various holes, with resist film 64 being coated on the outer surface of metal foil 8 (FIG. 2(f)). Subsequently, as shown in FIG. 8(a) (an oblique view), in the photolithography operation, wiring pattern 69 formed on a glass mask is exposed on resist film 64 formed on the outer surface. Subsequently, resist film 64 is developed to form a patterned resist film 5 on metal foil 8 (FIG. 2(g)).

When the tape is immersed in an etching solution, metal foil 8 is etched from opening portions 68 of patterned resist film 5.

Figure 2H:
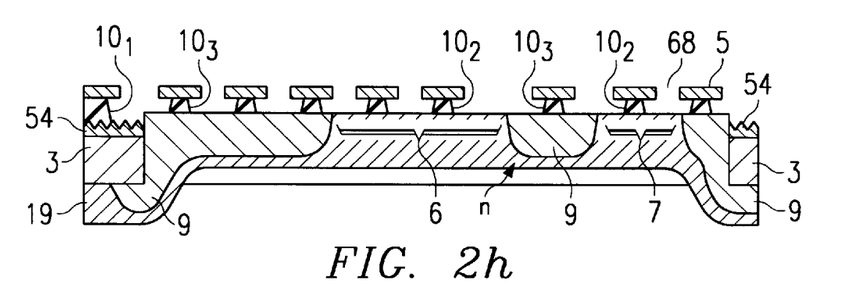

The surface portions of metal foil 8 on narrow groove 70 for cutting and fixture hole 71 for positioning are not protected by resist film 5, and they are all taken as opening portions 68. Consequently, metal foil 8 is completely removed in these portions. On the other hand, metal film wirings $10_1$–$10_3$ are formed on the surface of metal foil 8 on device hole 6, fixture hole 7, resin film 9, and film tape 3 protected by patterned resist film 5 (FIG. 2(h)).

Figure 2I:
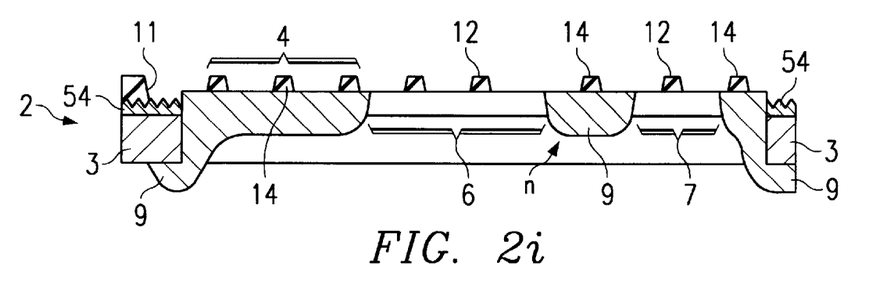
Figure 9:
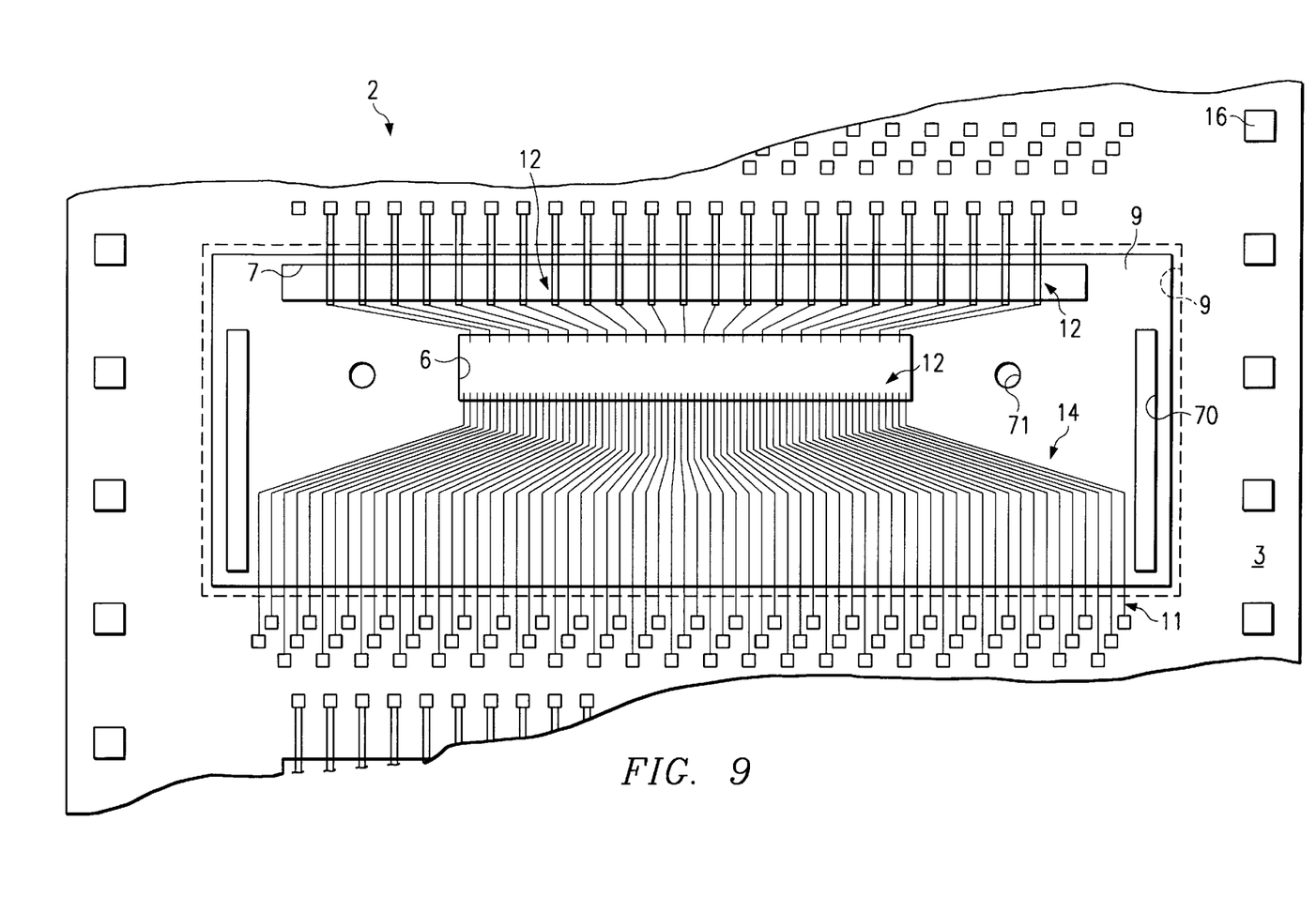
FIG. 9 is a plan view illustrating an example of the carrier tape of this invention.

Subsequently, when patterned resist film 5 and inner surface resist film 19 are removed, device hole 6 and fixture hole 7 are exposed. First wirings 11 are formed by metal film wirings $10_1$ on film tape 3, and second wirings 12 are formed by metal film wirings $10_2$ on inner surface resist film 19 above device hole 6 and fixture hole 7. Because resin film 9 is not removed when said resist films 5 and 19 are removed, metal wirings $10_3$ are fixed on resin film 9. Pitch-converting wirings 14 are formed by said metal wirings $10_3$ (FIG. 2(i)). FIG. 9 is a plane view illustrating the outer surface of the carrier tape in this state.

Second wirings 12 are arranged at a pitch as small as 70 $\mu$m, while first wirings 11 are arranged at a pitch as large as 100 $\mu$m. Pitch-converting wirings 14 are arranged at a pitch as small as that of said second wirings 12 on the side of second wirings 12. Pitch-converting wirings 14 are arranged at a pitch as large as that of first wirings 11 on the side of the portions connected to the liquid crystal panel. Second wirings 12 are connected to first wirings 11 by pitch-converting wirings 14.

Finally, a protective film (not shown in the figure) is formed on the pitch-converting portion where many pitch-converting wirings 14 are densely arranged. Semiconductor elements are accommodated in device hole 6, and the electrodes on the semiconductor elements are connected to second wirings 12. The semiconductor elements are cut off from the tape one by one so that they can be assembled on a liquid crystal panel or a printed circuit board.

In said carrier tape 2, a large hole 15 is formed on film tape 3, and fixture hole 16 for positioning as well as the narrow groove for cutting are formed by resin film 9 in addition to device hole 6 and lead hole 7. In this case, because only one type of die is needed for punching film tape 3, the cost of die is cut and the manufacturing period is shortened.

Figure 3A:
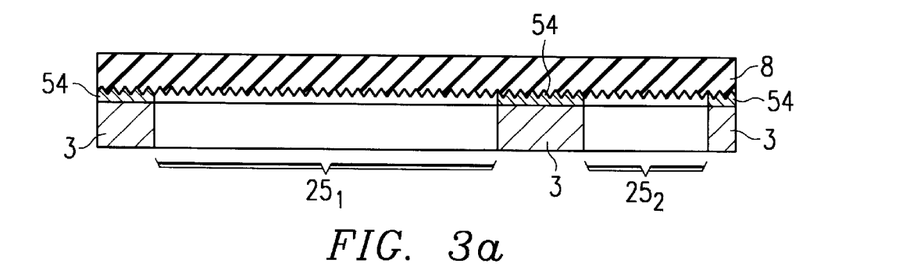
FIGS. 3(a)–(d) are process diagrams illustrating another example.
Figure 3B:
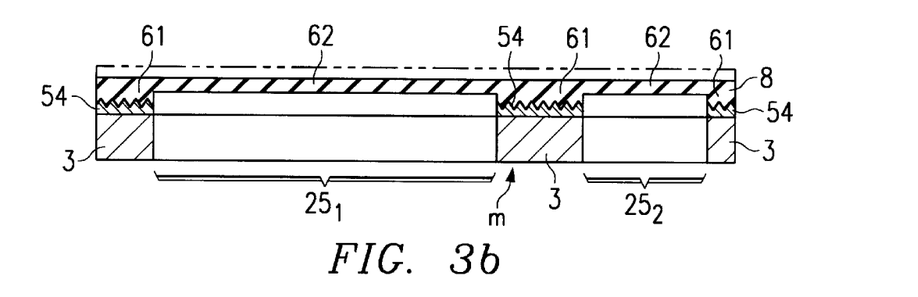
Figure 3C:
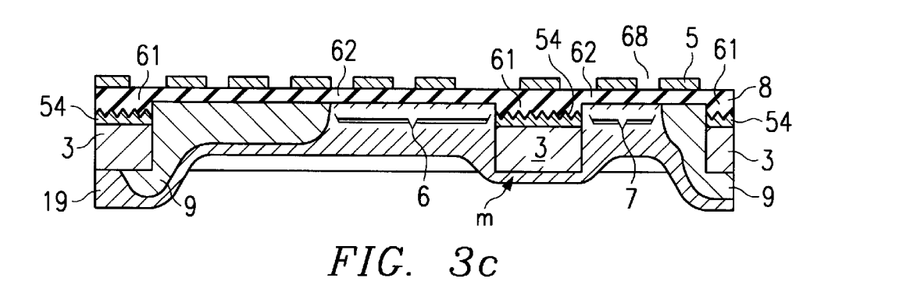
Figure 3D:
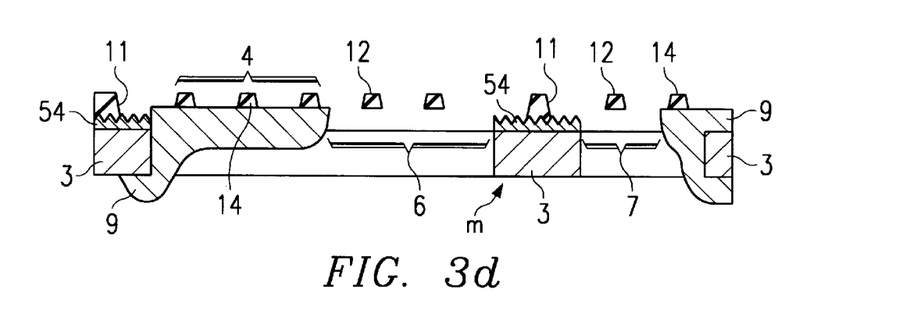

In said carrier tape 2, device hole 6 and lead hole 7 are separated/formed by resin film 9 (the portion of resin film 9 represented by symbol n in FIGS. 1(e) and 2(f)–(i)). However, it is also possible to use the following method: as shown in FIG. 3(a), when film tape 3 is punched, hole $25_1$ for device hole 16 and hole $25_2$ for lead hole 7 are separated by film tape 3 (the portion represented by the letter m) in advance; metal foil 8 is then laminated (FIG. 3(b)). In this case, when patterned resin film 9 is formed on the inner surface of metal foil 8 on hole $25_1$, the resin film is adhered and fixed to film tape 3 and metal foil 8 (FIG. 3(c)). Metal foil 8 is patterned by means of etching to form second wirings 12 on device hole 16, first wirings 11 on film tape 3, and pitch-converting wirings 14 on resin film 9 (FIG. 3(d)).

In carrier tape (2') with the aforementioned configuration, second wirings 12 arranged at small pitches and first wirings 11 arranged at large pitches are also connected by pitch-converting wirings 14 without a short circuit.

Figure 10A:
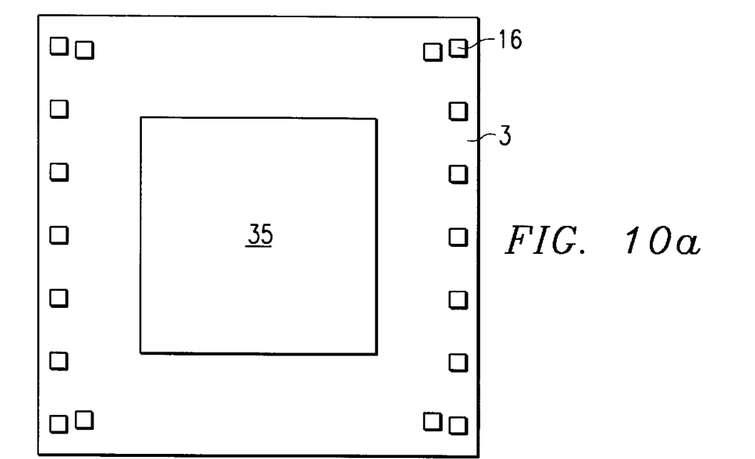
FIG. 10(a) is a plan view illustrating the state of the outer surface where a metal foil is formed.
Figure 10B:
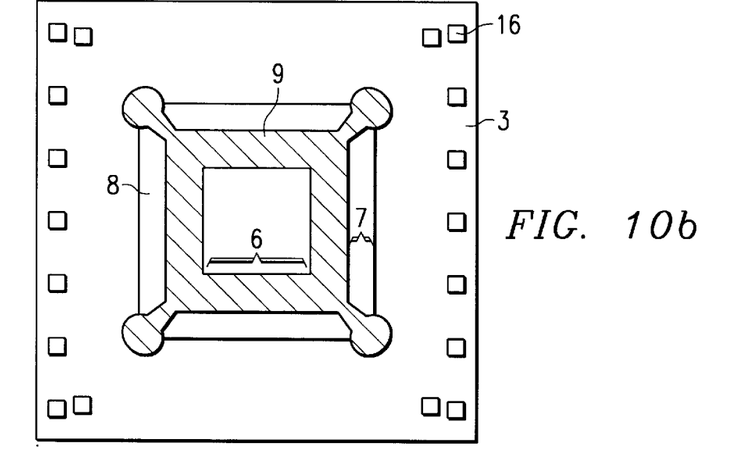
FIG. 10(b) is a plan view illustrating the state of the inner surface where a metal foil is formed.

This invention is also applicable to a Quad-type carrier tape. In this case, as shown in FIG. 10(a), a rectangular hole 35 is formed on film tape 3. As shown in FIG. 10(b) (a plane view illustrating the inner surface), after metal foil 8 is laminated on film tape 3, patterned resin film 9 is formed on the inner surface of metal foil 8 and is fixed on film tape 3 at the four corners of hole 35. Device hole 6 is formed in the central portion of said resin film 9, and lead hole 7 is formed by the gap between resin film 9 and film tape 3.

Figure 10C:
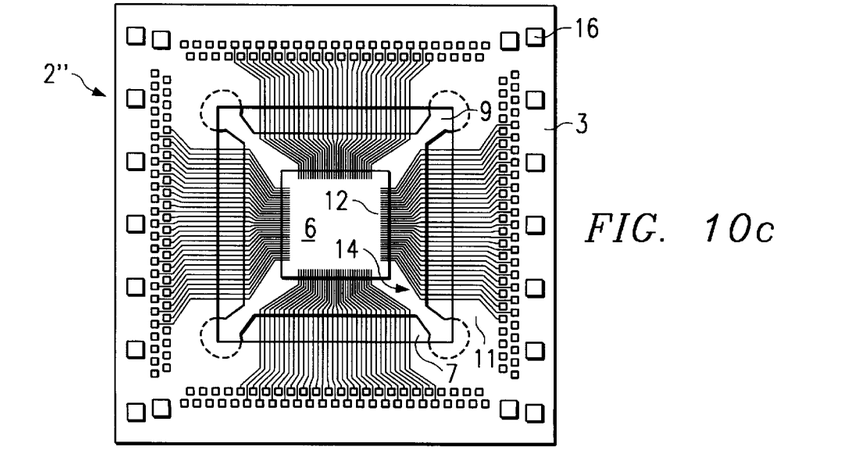
FIG. 10(c) is a plan view illustrating the state after the resist films are removed from the inner surface and the outer surface.

Subsequently, just as that done for said carrier tapes 2 and 2', the inner surface of metal foil 8 is protected by a resist film, and a patterned resist film is formed on the outer surface of the metal foil 8. As shown in FIG. 10(c) (a plane view illustrating the outer surface of the tape), second wirings 12 are formed from the four sides of device hole 16 to the interior. Also, pitch-converting wirings 14 are formed on resin film 9 and first wirings 11 are formed on film tape 3. In said carrier tape (2"), second wirings 12 are arranged at small pitches and are connected to first wirings 11 arranged at large pitches by pitch-converting wirings 14.

As described in the above, a polymide resin film is used as said resin film 9. This, however, is not exclusive. For example, it is also possible to use glass/epoxy resin or other resins. It is desirable to use a type of resin that can be patterned by means of photolithography.

Figure 4A:
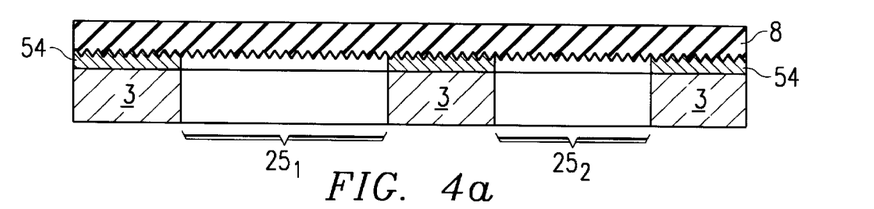
FIGS. 4(a)–(e) are the first half of the process diagrams of this invention illustrating the case in which three types of metal wirings with different thicknesses are formed.
Figure 4B:
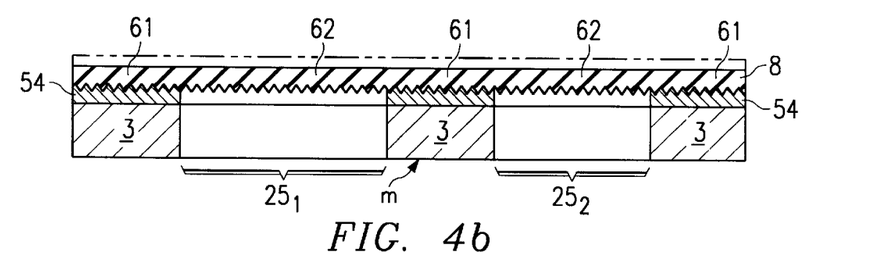

In the aforementioned embodiment, metal foil 8 is etched once. However, it is also possible to etch the metal foil several times. An example is explained with reference to FIGS. 4 and 5. In this case, adhesive layer 54 is formed on the surface of film tape 3, which is punched by dies to form holes $25_1$ and $25_2$. Metal coil 8 made of a conductor is thermocompression bonded to adhesive layer 54. Holes $25_1$ and $25_2$ are covered by metal foil 8 (FIG. 4(a)).

The inner surface of metal foil 8 is subjected to a roughening treatment to increase the adhesion to adhesive layer 54. When the tape is dipped in an etching solution for a chemical polishing treatment to degrease and smoothen the rough surface after metal foil 8 is laminated, the inner surface is thinned by as much as the etching quantity of the rough surface (FIG. 4(b)).

Figure 4C:
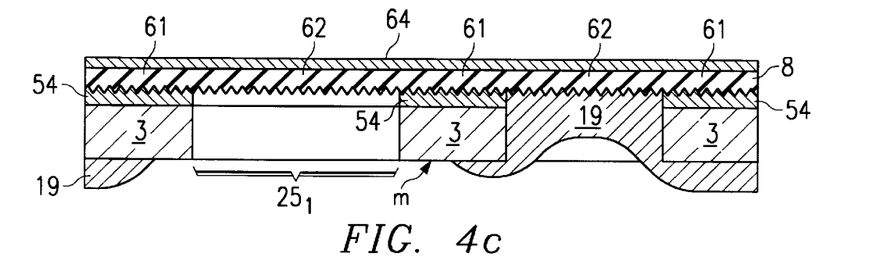

Subsequently, resist film 64 is coated on the whole surface of metal foil 8, and inner surface resist film 19 is coated in hole $25_2$ (lead hole) (FIG. 4(c)). In this case, inner surface resist film 19 can be coated using a printing method. However, it is preferred to form the resist film appropriately so that it can be patterned by means of photolithography.

Figure 4D:
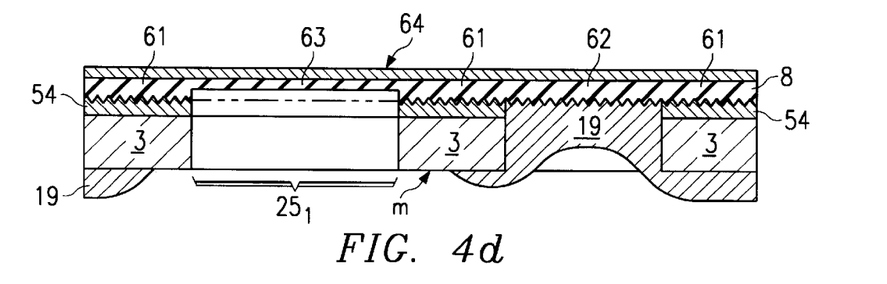

Subsequently, when a chemical polishing treatment is performed again by means of etching, the thickness of portion 63 of metal foil 8 in hole $25_1$ becomes smaller than that of portion 62 on film tape 3 (FIG. 4(d)).

Figure 4E:
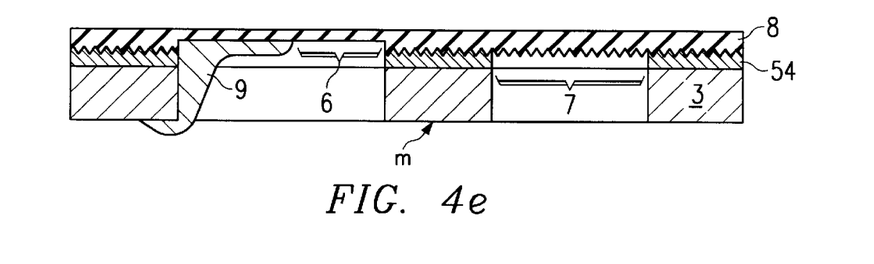

After etching is finished, resist film 64 and inner surface resist film 19 are removed (FIG. 4(e)). Once again, resist film 64 is formed on the surface of metal foil 8, and inner surface resist film 19 is formed in holes $25_1$ and $25_2$ (FIG. 5(f)). Afterwards resist film 64 is exposed and developed to form patterned resist film 5 (FIG. 5(g)). Subsequently, pattern etching of metal foil 8 is performed (FIG. 5(h)).

Figure 5F:
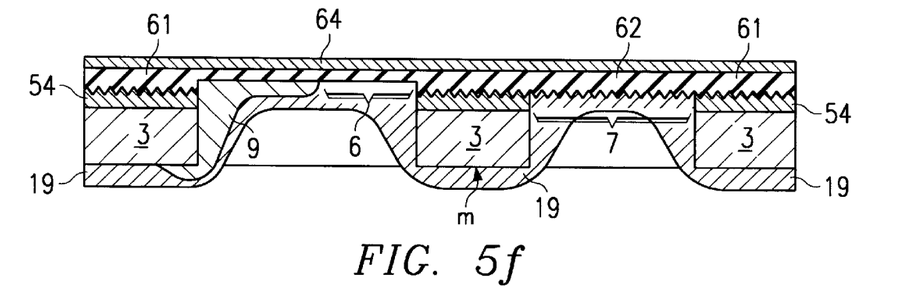
FIGS. 5(f)–(i) are the second half of the aforementioned process diagrams.
Figure 5G:
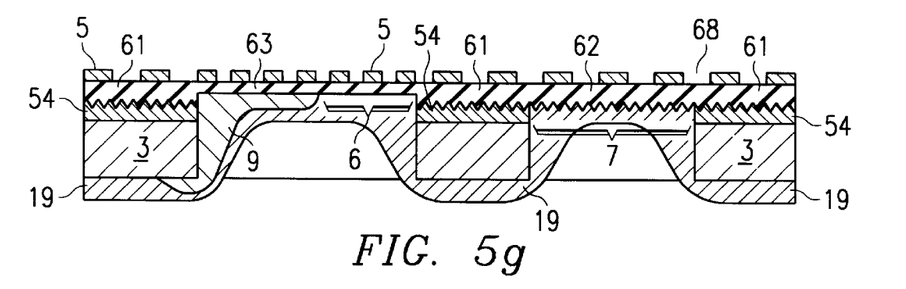
Figure 5H:
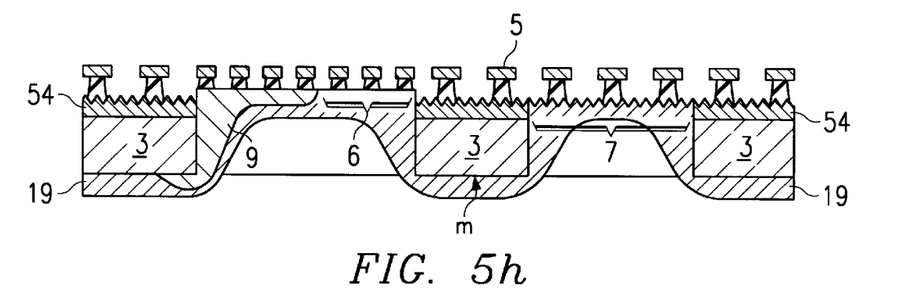
Figure 5I:
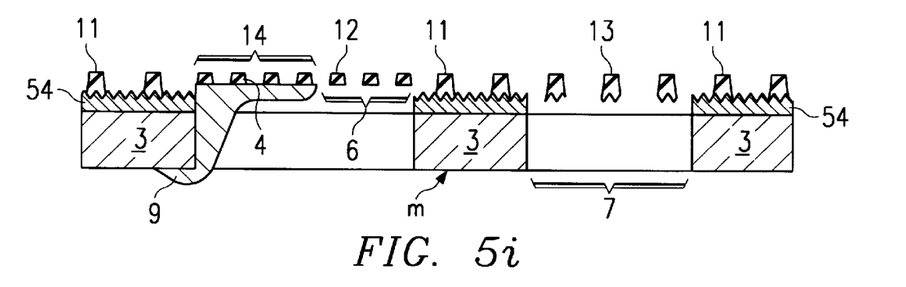

After patterned resist film 5 and inner surface resist film 19 are removed, first wirings 11 are formed at large pitches on film tape 3, and second wirings 12 (inner leads) are formed at small pitches on device hole 6. Also, metal wirings 13 with a film thickness between those of first wiring 11 and second wiring 12 are formed on lead hole 7.

In the aforementioned example, three types of wirings with different thicknesses are formed. The thickness of metal foil 8 can be controlled by performing the coating of inner surface resist film 19, etching of metal foil 8, and formation of resin film 9 for a prescribed number of rounds. Therefore, it is possible to form multiple types of wirings with different thicknesses.

In this invention, hole $25_1$ (device hole) is formed so that the semiconductor elements can be assembled either on the inner surface or on the outer surface. However, if the semiconductor elements are only assembled on the outer surface, device hole $25_1$ becomes unnecessary. Consequently, the device hole can be filled with a resin; metal foil 8 in the second wiring portion becomes very thin and can be arranged at small pitches. In this case, the metal wirings used for connection are formed on the resin and supported by this resin. Consequently, there is no overhanging portion in the device hole or the lead hole. As a result, curvature, breakage, and other strength defects can be prevented.

The wirings arranged at small pitches and the wirings arranged at large pitches can be connected to each other without having any short circuit between the wirings.

Because the types of dies used for punching are reduced, the manufacturing period can be shortened and the cost can be cut.

Because the pitch-converting wirings are fixed on the resin film without using any adhesive layer, the relative difficulty of bending can be easily varied by changing the thickness of the coated resin film.

Also, because it is possible to form the metal film in multiple types of thicknesses, the wiring pattern design can be facilitated.

I claim:

1. A carrier tape comprising:
   a first film having a hole therein for mounting a first electronic device;
   a metal film laminated on said film including the area of said tape containing said hole, a portion of said metal film in the area of said hole being thinner than a remaining portion of said metal film;
   a second film formed over said metal film in an area of said hole;
   said metal film being patterned into unsupported leads for connecting to said first electronic device, printed wiring supported by said first film for connecting to a second electronic device and intermediate wiring supported by said second film connecting said unsupported leads and said printed wiring.

2. The carrier tape of claim 1 wherein said intermediate wiring permits connecting two electronic devices which are not on the same plane.

3. The carrier tape of claim 1 wherein said first electronic device is an integrated circuit.

4. The carrier tape of claim 2 wherein said first electronic device is an integrated circuit.

5. The tape carrier of claim 1 wherein said second electronic device is a display.

6. The tape carrier of claim 2 wherein said second electronic device is a display.

7. The tape carrier of claim 5 wherein said display is an LCD and wherein said first electronic device is an integrated circuit is mounted on said LCD.

8. A method of making a tape carrier comprising the steps of:
   providing a film tape;
   making a hole in said tape for mounting a first electronic device;
   laminating a metal film on one surface of said film tape;
   etching said film tape with said laminated metal film, whereby metal film covering said hole is etched to be thinner than metal film on other portions of said film tape;
   forming a second film on said metal film in an area of said hole;
   patterning said metal film into unsupported leads for connecting to said first electronic device, printed wiring supported by said film tape for connecting to a second electronic device and intermediate wiring supported by said second film connecting said unsupported leads and said printed wring.

9. The method of claim 8 wherein said second film is a resin film.

10. The method of claim 8 wherein said patterning step comprises etching said metal film.

11. The method of claim 9 wherein said patterning step comprises etching said metal film.

12. The method of claim 8 wherein the metal film is patterned into said unsupported leads having a finer pitch than said printed wiring and wherein said intermediate wiring is a pitch-converting wiring.

13. The method of claim 10 wherein the metal film is patterned into said unsupported leads having a finer pitch than said printed wiring and wherein said intermediate wiring is a pitch-converting wiring.

14. The method of claim 11 wherein the metal film is patterned into said unsupported leads having a finer pitch than said printed wiring and wherein said intermediate wiring is a pitch-converting wiring.

* * * * *